US011630166B1

(12) United States Patent
Fisher et al.

(10) Patent No.: US 11,630,166 B1
(45) Date of Patent: Apr. 18, 2023

(54) SUPERCONDUCTING QUANTUM INTERFERENCE ARRAY RECEIVER AND METHOD FOR DIGITALLY CONTROLLING MAGNETIC FLUX BIAS THEREOF

(71) Applicant: United States of America as represented by the Secretary of the Navy, San Diego, CA (US)

(72) Inventors: Eric C. Fisher, Poway, CA (US); Marcio C. de Andrade, San Diego, CA (US); Brian A. Higa, San Diego, CA (US); Michael O'Brien, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 131 days.

(21) Appl. No.: 17/460,767

(22) Filed: Aug. 30, 2021

(51) Int. Cl.
*G01R 33/54* (2006.01)
*G01R 33/035* (2006.01)

(52) U.S. Cl.
CPC .................. *G01R 33/0354* (2013.01)

(58) Field of Classification Search
CPC ................ G01R 33/0354; G01R 33/00; G01R 33/0035; G01R 33/0023; G01R 33/0017;
(Continued)

(56) References Cited

U.S. PATENT DOCUMENTS 4,004,217 A   1/1977  Giffard
4,389,612 A   6/1983  Simmonds
(Continued)

FOREIGN PATENT DOCUMENTS

JP   2005188947   7/2005

OTHER PUBLICATIONS

Finlay, C. C. et. al., "International Geomagnetic Reference Field: the eleventh generation" Geophysical Journal International, vol. 183 (2010) pp. 1216-1230, https://doi.org/10.1111/j.1365-246X.2010.04804.x.

(Continued)

*Primary Examiner* — Jermele M Hollington
*Assistant Examiner* — Taqi R Nasir
(74) *Attorney, Agent, or Firm* — Naval Information Warfare Center, Pacific; Kyle Eppele; J. Eric Anderson

(57) ABSTRACT

A receiver for detecting at least one electromagnetic signal while the receiver is moving relative to the Earth's magnetic field, the receiver comprising: an SQUID array for generating an output that is a transfer function of SQUID array magnetic flux that is supplied from a combination of an oscillating magnetic field of the at least one electromagnetic signal, the Earth's magnetic field, and a bias magnetic field; a bias-tee configured to divide the SQUID array output into a DC signal and an RF signal; a memory store configured to store a plurality of voltage and flux bias values, wherein each voltage value has a corresponding flux bias value that results in maximum SQUID array sensitivity; and a logic circuit configured to find a voltage value in the memory store that most closely matches the DC signal, and to apply to the SQUID array a flux bias corresponding to the most closely matched voltage value.

16 Claims, 3 Drawing Sheets

(58) Field of Classification Search
CPC ............ G01R 31/3191; G01R 33/0358; G01R 33/0356; G01B 7/004; G01C 17/38; G06F 3/017; G06F 3/0346; G06F 3/012; H01L 39/223

See application file for complete search history.

(56) References Cited

U.S. PATENT DOCUMENTS

| | | | |
|---|---|---|---|
| 5,387,864 | A | 2/1995 | Gershenson |
| 6,362,617 | B1 | 3/2002 | Hubbell |
| 6,448,767 | B1 | 9/2002 | Ganther |
| 8,179,133 | B1* | 5/2012 | Kornev ............ G01R 33/0354 324/225 |
| 9,097,751 | B1 | 8/2015 | Longhini |
| 9,476,951 | B2 | 10/2016 | Orozco |
| 2011/0285393 | A1 | 11/2011 | Zakosarenko |
| 2012/0088674 | A1* | 4/2012 | Faley ................. G01R 33/0354 505/150 |
| 2019/0341540 | A1* | 11/2019 | Megrant ................ H10N 60/01 |

OTHER PUBLICATIONS

Maxwell, James Clerk, A Treatise on Electricity and Magnetism, vol. II (1873) pp. 313-327.

Mantiply, Edwin D., et al., "Summary of Measured Radiofrequency Electric and Magnetic Fields (10 kHz to 30 GHz) in the General and Work Environment" Bioelectromagnetics, vol. 18 (1997) pp. 563-577.

Mukhanov, O. et. al., "Superconducting Quantum Arrays for Wideband Antennas and Low Noise Amplifiers" International Microwave Symposium (Jun. 2014).

\* cited by examiner

SUPERCONDUCTING QUANTUM INTERFERENCE ARRAY RECEIVER AND METHOD FOR DIGITALLY CONTROLLING MAGNETIC FLUX BIAS THEREOF

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, Calif., 92152; voice (619) 553-5118; ssc_pac_t2@navy.mil. Reference Navy Case Number 111214.

BACKGROUND OF THE INVENTION

The invention described herein relates to superconducting quantum interference devices (SQUIDs). An array of SQUIDs may be used to detect magnetic fields. An array of identical SQUIDs is referred to herein as an "SQA", while an array of SQUIDs wherein the individual SQUIDs do not necessarily have the same area are referred to herein as a superconducting quantum interference filter or "SQIF". When an SQA/SQIF is operated in motion, such as on a moving platform, the orientation of the SQA/SQIF sensor with respect to the earth's magnetic field varies with time. Changing the spatial orientation of the SQA/SQIF with respect to the earth's magnetic field changes the magnitude of the magnetic field the SQA/SQIF measures. Directionality and variations in the magnitude of earth's magnetic fields at different geographical locations are sufficiently large to affect the accuracy of SQA/SQIF as it moves between the different geographical locations. There is a need to account for these variations in the earth's magnetic field while an SQA/SQIF is simultaneously in motion and exposed to incident radio frequency (RF) signals.

SUMMARY

Disclosed herein is a receiver and method for detecting at least one electromagnetic signal while the receiver is moving with changing orientation relative to the Earth's magnetic field. In one example embodiment, the receiver comprises an SQUID array, a bias-tee, a memory store, and a logic circuit. The SQUID array is configured to generate an output that is a transfer function of a magnetic flux through the SQUID array. The magnetic flux is supplied from a combination of an oscillating magnetic field of the at least one electromagnetic signal, the Earth's magnetic field, and a bias magnetic field. The bias-tee is configured to divide the SQUID array output into a direct current (DC) signal and an RF signal. The memory store is configured to store a plurality of voltage and flux bias values. Each voltage value has a corresponding flux bias value that results in maximum SQUID array sensitivity. The logic circuit is configured to find a voltage value in the memory store that most closely matches the DC signal, and to apply to the SQUID array a flux bias corresponding to the most closely matched voltage value.

One example embodiment of the method for detecting at least one electromagnetic signal comprises the following steps. One step provides for generating a table of voltages and corresponding flux biases that result in maximum sensitivity of the SQUID array and storing the table in a memory store. Another step provides for moving the SQUID array with changing orientation relative to the Earth's magnetic field. Another step provides for monitoring an output voltage of the SQUID array. Another step provides for using a processor to incrementally adjust a magnetic flux bias of the SQUID array at timed intervals based on the monitored output voltage so as to maintain the flux bias within a predetermined range.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed receiver and method and below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and receivers described herein as will be understood by one of ordinary skill in the art unless otherwise stated specifically.

References in the present disclosure to "one embodiment," "an embodiment," or any variation thereof, means that a particular element, feature, structure, or characteristic described in connection with the embodiments is included in at least one embodiment. The appearances of the phrases "in one embodiment," "in some embodiments," and "in other embodiments" in various places in the present disclosure are not necessarily all referring to the same embodiment or the same set of embodiments.

As used herein, the terms "comprises," "comprising," "includes," "including," "has," "having," or any variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of words such as "the," "a," or "an" are employed to describe elements and components of the embodiments herein; this is done merely for grammatical reasons and to conform to idiomatic English. This detailed description should be read to include one or at least one, and the singular also includes the plural unless it is clearly indicated otherwise.

Figure 1:
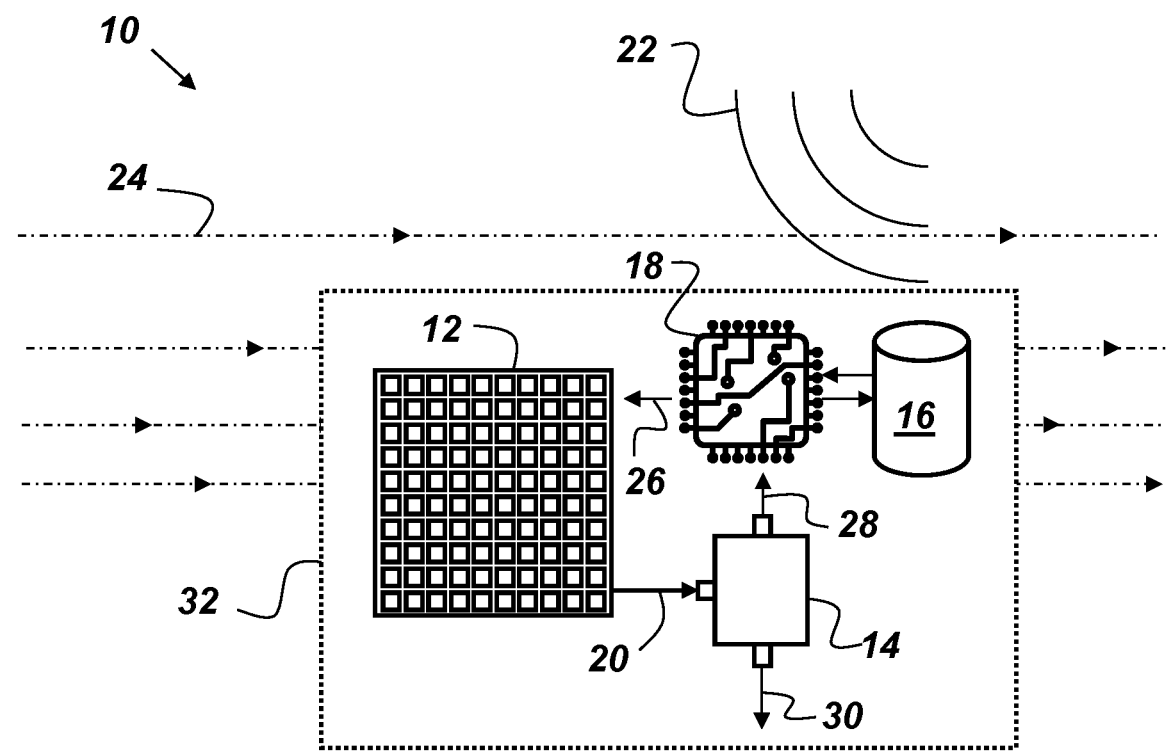
FIG. 1 is an illustration of an example embodiment of an SQUID array receiver.

FIG. 1 is an illustration of an example embodiment of an SQUID array receiver 10 that comprises, consists of, or consists essentially of an SQUID array 12, a bias-tee 14, a memory store 16, and a logic circuit 18. The SQUID array 12 is configured to generate an output 20 that is a transfer function of a magnetic flux through the SQUID array 12. The magnetic flux is supplied from a combination of an oscillating magnetic field of at least one incoming electromagnetic signal 22, the Earth's magnetic field 24, and a bias magnetic field from a bias signal 26. The bias-tee 14 is configured to divide the SQUID array output 20 into a direct current (DC) signal 28 and an RF signal 30. The RF signal 30 carries the detected RF electromagnetic (i.e., the incoming electromagnetic signal 22) at the SQUID array 12. It is preferable for the bias-tee 14 to have broadband RF characteristics. The SQUID array 12 may be either a SQA or a SQIF. Although the SQUID array 12 in FIG. 1 is illustrated as having constituent SQUIDS with the same areas, it is possible that the individual SQUID areas can be varied.

The memory store 16 is configured to store a plurality of voltage and flux bias values. Each voltage value in the memory store 16 has a corresponding flux bias value that results in maximum SQUID array sensitivity. The logic circuit 18 is configured to find a voltage value in the memory store 16 that most closely matches the DC signal 28, and to apply to the SQUID array a flux bias signal 26 corresponding to the most closely matched voltage value. The SQUID array receiver 10 may be mounted to a platform 32 that moves with respect to the Earth's magnetic field 24. Note, FIG. 1 is offered as an example illustration only, and it is to be understood that the platform may move in many different directions and/or change orientation with respect to the Earth's magnetic field 24. Suitable examples of the platform 32 include, but are not limited to, a ground vehicle, an aircraft, a space-based platform, an underwater vehicle, a surface vessel, and a vehicle designed to move underground.

The SQUID array 12 may comprise any desired number of SQUIDs. For example, the SQUID array 12 depicted in FIG. 1 comprises ten SQUIDs arranged in series, but it is to be understood that any desired number of SQUIDs in any desired configuration may be used for the SQUID array 12. The SQUID array 12 may be a planar array, but it is not limited to planar embodiments. For example, the SQUID array 12 may be a three-dimensional array of SQAs and/or SQIFs.

The bias-tee 14 separates the DC and RF components of the received signal 22. The DC signal or low frequency source may be used to voltage bias a device such as a SQA/SQIF. The RF signal normally carries data to and from a device. Bias-tees come in a variety of specifications such as insertion loss and cut off frequency and the one used in any given scenario will depend on the application. The memory store 16 may be any non-transitory storage device capable of storing the plurality of voltage and flux bias values in such a way that is searchable and retrievable by the logic circuit 18. Suitable examples of the memory store 16 include, but are not limited to, magnetic computer disks, optical disks, electronic memories, solid-state memories, and non-transitory computer-readable storage media. The logic circuit 18 may be any physical computing device, such as a hardware device processor, capable of receiving inputs, performing calculations, and outputting a response.

Figure 2:
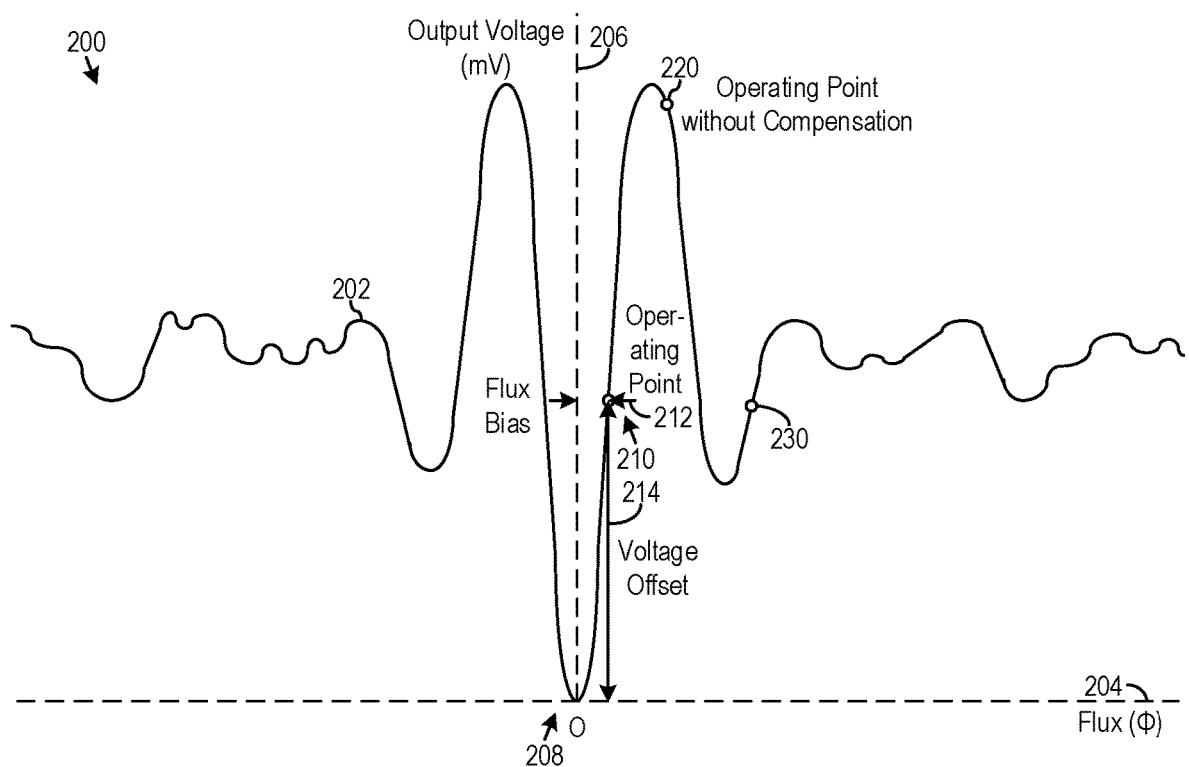
FIG. 2 is a graph of the output of an embodiment of an SQUID array.

FIG. 2 is a graph 200 of a prior art example of an output from a SQUID array, that is representative of the SQUID array output 20, which is represented by a transfer function 202 between a magnetic flux through the SQUID array 12 along a horizontal axis 204 and an output voltage from the SQUID array 12 along a vertical axis 206 in accordance with an embodiment of the SQUID array receiver 10. The horizontal axis 202 is representative of the magnetic flux through the SQUID array 12. The vertical axis 20 is representative of the SQUID array 12's output voltage expressed in millivolts. The graph's origin 208 at the intersection between axes 204 and 206 is where the magnetic flux through the SQUID array 12 has a value of zero flux and the output voltage is zero millivolts. Because the transfer function 202 passes through origin 208, when no net magnetic flux passes through the SQUID array 12, the output voltage from the SQUID array is zero millivolts.

As the magnetic flux increases from zero at origin 208, the output voltage from transfer function 202 increases slowly at first, and then enters an extended region of steep slope where the output changes considerably when the magnetic flux changes slightly, especially as compared any other monotonic region of the transfer function 202. This region is centered on the ideal operating point 210 having a magnetic flux bias 212 and a voltage offset 214. When the SQUID array 12 is operating at operating point 210, the transfer function 202 shows that the SQUID array 12 detects and amplifies small changes in the magnetic flux passing through the SQUID array 12 into considerable changes in the output voltage from the SQUID array 12. This detection and amplification of transfer function 202 is approximately linear across a range of the magnetic flux centered on the flux bias 212 of the operating point 210, with the linear range extending from nearly zero flux to nearly twice the flux bias 212. Within this linear range, the output voltage of the SQUID array 12 changes considerably from the voltage offset 214 of the operating point 210 in response to the magnetic flux changing slightly from the flux bias 212 of the operating point 210—with the linear range extending from an output voltage of nearly zero millivolts to nearly twice the voltage offset 214.

When the SQUID array receiver 10 operates in motion, such as on a ship or an aircraft, the orientation of the SQUID array 12 with respect to the Earth's magnetic field 24 varies with time. Because the SQUID array 12 responds to the component of the combined magnetic field passing perpendicularly through a plane of the SQUID array 12, the strength of the perpendicular component of the magnetic field as measured by SQUID array 12 changes with the changing spatial orientation between SQUID array 12 and the Earth's magnetic field 24. These changes in relative orientation between SQUID array 12 and the Earth's magnetic field 24 are sufficiently large to move the operating point from the desired operating point 210 to a non-amplifying operating point 220.

Furthermore, the strength of the Earth's magnetic field 24 ranges from about 25 µT to 65 µT across the Earth's surface. This entire range cannot fit within the available linear range of the SQUID array 12 of the example embodiment providing high amplification. Thus, variations in the strength and direction of the Earth's magnetic field 24 with geographical location are also sufficiently large to move the operating point from the desired operating point 210 to a non-amplifying operating point 220.

The range of compensation needed is as much as the 130 µT change occurring when an aircraft carrying the SQUID array receiver 10 reverses direction from parallel to anti-parallel to the Earth's magnetic field 24 at a geographical location where the Earth's magnetic field 24 is maximal at 65 µT. Significant changes in the Earth's magnetic field 24 (e.g. on the order of 1 µT) due solely to changes in geographical location can require hours of movement of the platform 32. Minutes are required for significant changes in orientation between a large embodiment of the platform 32 such as a ship and the Earth's magnetic field 24. About one second is required for significant changes in orientation between a small embodiment of the platform 32 such as an aircraft and the Earth's magnetic field 24 during a banking maneuver. Less than a second is required for significant changes in orientation between a small aircraft and the Earth's magnetic field 24 during a roll maneuver. Thus, the cut-off frequency may be selected as 200 Hz for an example embodiment of the SQUID array receiver 10 to compensate for changes in the Earth's magnetic field 24 within an order of magnitude of the expected changes.

In one example embodiment of the SQUID array receiver 10, the movement that changes the orientation of the SQUID array 12 relative to the Earth's magnetic field 24 induces some or all of a low-frequency portion of the external magnetic field. In such a scenario, the bias signal 26 provides nullifying feedback to the SQUID array 12 that counterbalances at least the changing orientation between SQUID array 12 and the Earth's magnetic field 24. Further, in this scenario, the SQUID array output 20 detects the high-frequency portion of the oscillating magnetic field of the at least one incoming electromagnetic signal 22. For example, one embodiment of the SQUID array receiver 10 may be used to concurrently detect multiple radio-frequency electromagnetic signals 22 with frequencies up to 100 GHz.

In one embodiment, the SQUID array 12 may be a planar array of bi-SQUIDs, each including a loop of superconducting material broken by three Josephson junctions. The SQUIDs in this planar array embodiment are connected in series for conducting a shared current from a current source. The SQUIDs in the planar array are spatially arranged with respective sizes distributed to provide the transfer function 202 for a particular value of the shared current from the current source. To provide the transfer function 202 providing a range of high amplification of the magnetic flux through the SQUID array 12, the number of SQUIDs in the SQUID array 12 may be hundreds or thousands of SQUIDs, with more SQUIDs in the SQUID array 12 generally providing higher amplification because the SQUID array output 20 accumulates the voltage across each individual SQUID in the planar array.

Referring briefly back to FIG. 2, if the magnetic flux through the SQUID array 12 gets too high, such as more than twice the flux bias 212, the transfer function 202 exits the linear range with high amplification. There are several possible causes for the magnetic flux through the SQUID array 12 getting too high. An electromagnetic signal strongly driven from a nearby antenna can produce an incoming signal 22 having a range of magnetic flux spanning more than twice the flux bias 212. Then, even if the DC operating point is operating point 210, the oscillating magnetic field of the incoming signal 22 produces an amplified output voltage with distortion that truncates the peaks of the oscillating magnetic field of the incoming signal 22, and this non-linearity generally inhibits concurrently detecting other weaker electromagnetic signals of different frequencies. Another possible cause for the magnetic flux getting too high is an external magnetic field, such as the Earth's magnetic field 24, providing a nominally constant flux that moves the operating point from the desired operating point 210 to a new operating point 220, which produces little or no amplification of oscillating magnetic field of the incoming signal 22.

Typically, the characteristic magnetic-flux-to-voltage transfer curve of an SQUID array is not periodic. In spite of the non-periodicity of the flux to voltage transfer curve, the SQUID array receiver 10 may be biased in any desired time frame to appropriately compensate for changes in orientation of the SQUID array receiver 10 with respect to the Earth's magnetic field 24. For example, the SQUID array receiver 10 may be biased in near real time (i.e., <10 milliseconds). A specific, initial flux bias may be set for the SQUID array 12 resting at any position. This initial flux bias value may be found by searching through a database of realistic flux bias values. The logic circuit 18 is configured to incrementally adjust the flux bias of the SQUID array 12 while the SQUID array receiver 10 is in motion with respect to the Earth's magnetic field 24.

The bias-tee 14 may be used to set a current bias point of the SQUID array 12 and a second independent bias for the flux bias. One example embodiment of the bias-tee 14 is configured to divide the SQUID array output signal 20 into DC and RF signals where the cutoff between the two frequency ranges is about 12 kHz. The bias-tee 14 also separates the lower and higher frequency components of the SQUID array output 20. The voltage on the DC terminal of the bias-tee 14 represents the measured bias point of the SQUID array 12 and is the input to the logic circuit 18. The logic circuit 18 may be configured to periodically find the voltage value in the memory store 16 that most closely matches the DC signal 28, and to apply to the SQUID array 12 the flux bias corresponding to the most closely matched voltage value. Every measurement period, the logic circuit 18 may find the voltage value by performing the following control calculation:

$$\Phi_n = \Phi_{n-1} + \frac{1}{B}\sum_{i=1}^{n}(v_i - v_{i-1})$$

where B represents the sensitivity of the SQUID array 12, $v_n$ represents the voltage measured at time n, $\Phi_n$ represents the magnetic flux at a time n represents the number of periods, and i is an index. The time n may be measured in number of measurement periods. The logic circuit 18 finds B, $v_0$, and $\Phi_0$ by storing the relationship between flux bias and output voltage in an array of values in the memory store 16. The logic circuit 18 then processes those values to obtain the flux bias that results in the maximum sensitivity of the SQUID array 12 at a given time n and the corresponding output voltage. The sensitivity at the point where $v=v_0$ may change with time. The system remains stable as long as the actual sensitivity preferably stays above 3 dB below the initial measured sensitivity.

In one embodiment of the SQUID array receiver 10, the logic circuit 18 is configured to find the voltage value periodically at a frequency less than or equal to 12 kilohertz. This allows for a slow biasing system operating below 12 Hz, which allows for the system to be implemented with a slower computational device than an analog circuit, such as a processor. The lack of periodicity requires the bias point to be measured and set before maintenance of it can begin.

Figure 3:
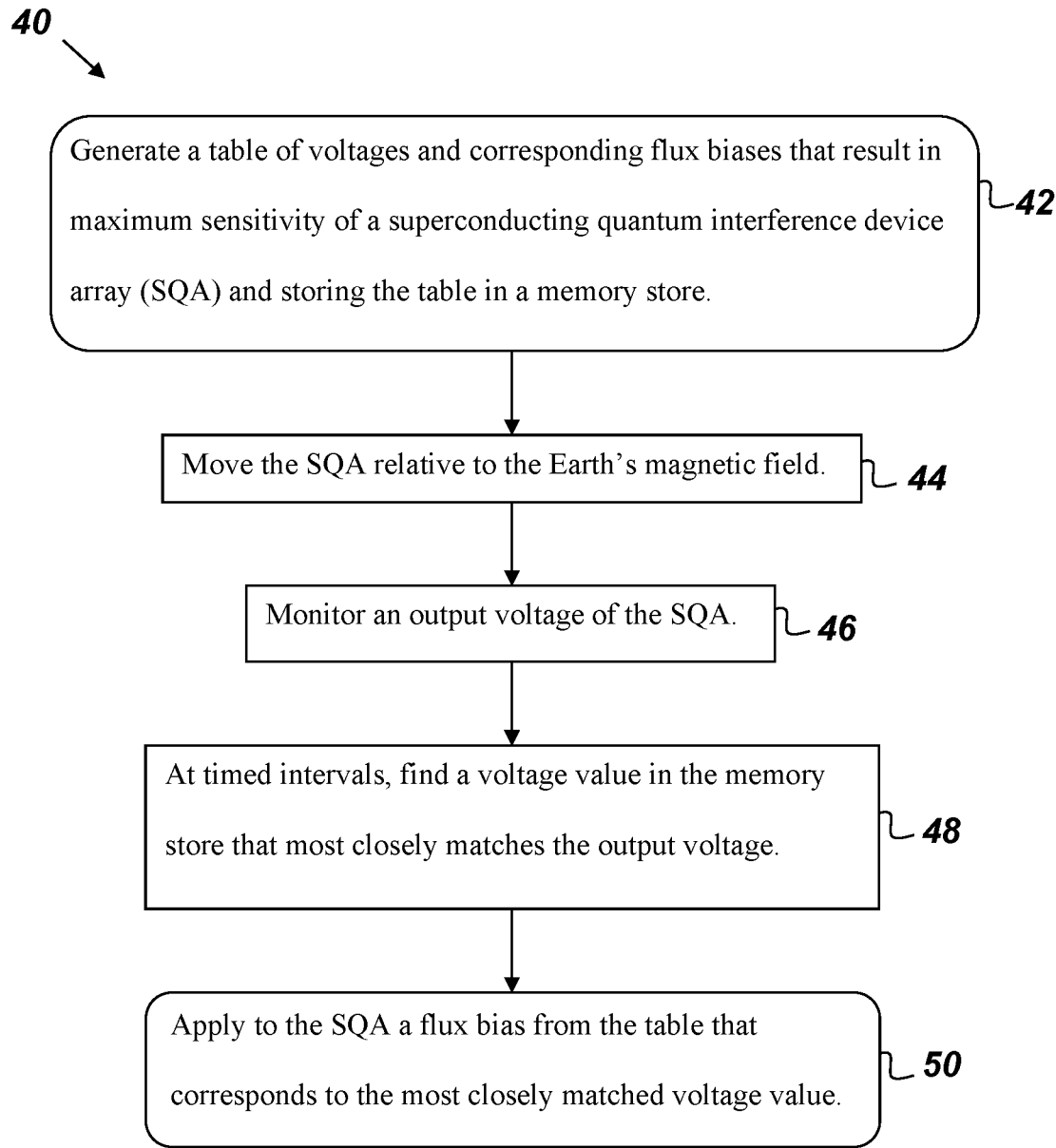
FIG. 3 is a flowchart of a method for detecting at least one electromagnetic signal comprising the following steps.

FIG. 3 is a flowchart of a method 40 for detecting at least one electromagnetic signal comprising the following steps. A step 42 provides for generating a table of voltages and corresponding flux biases that result in maximum sensitivity of a superconducting quantum interference device array (SQUID array) and storing the table in a memory store. Another step 44 provides for moving the SQUID array relative to the Earth's magnetic field. Another step 46 provides for monitoring an output voltage of the SQUID array. Another step 48 provides for finding, at timed intervals, a voltage value in the memory store that most closely matches the output voltage. Another step 50 provides for applying to the SQUID array a flux bias from the table that corresponds to the most closely matched voltage value. The magnetic flux bias can be actively updated to maintain a minimum sensitivity threshold in response to changes in SQUID array sensitivity.

From the above description of the SQUID array receiver 10 and the method 40, it is manifest that various techniques may be used for implementing the concepts of the SQUID array receiver 10 and the method 40 without departing from the scope of the claims. The described embodiments are to be considered in all respects as illustrative and not restrictive. The receiver/method disclosed herein may be practiced in the absence of any element that is not specifically claimed and/or disclosed herein. It should also be understood that the SQUID array receiver 10 and the method 40 are not limited to the particular embodiments described herein, but are capable of many embodiments without departing from the scope of the claims.

We claim:

1. A receiver for detecting at least one electromagnetic signal while the receiver is moving with changing orientation relative to the Earth's magnetic field, the receiver comprising:
    a superconducting quantum interference device array (SQUID array) for generating an output that is a transfer function of a magnetic flux through the SQUID array, wherein the magnetic flux is supplied from a combination of an oscillating magnetic field of the at least one electromagnetic signal, the Earth's magnetic field, and a bias magnetic field;
    a bias-tee configured to divide the SQUID array output into a direct current (DC) signal and a radio frequency (RF) signal;
    a memory store configured to store a plurality of voltage and flux bias values, wherein each voltage value has a corresponding flux bias value that results in maximum SQUID array sensitivity; and
    a logic circuit configured to find a voltage value in the memory store that most closely matches the DC signal, and to apply to the SQUID array a flux bias corresponding to the most closely matched voltage value.

2. The receiver of claim 1, wherein the SQUID array is planar.

3. The receiver of claim 1, wherein a characteristic magnetic-flux-to-voltage transfer curve is not periodic.

4. The receiver of claim 3, wherein the logic circuit is configured to find the voltage value periodically.

5. The receiver of claim 4, wherein the logic control circuit is configured to perform the following calculation every period:

$$\Phi_n = \Phi_{n-1} + \frac{1}{B}\sum_{i=1}^{n}(v_i - v_{i-1})$$

where B represents the sensitivity of the SQUID array, Φ represents the magnetic flux, n represents the number of periods, and i is an index.

6. The receiver of claim 5, wherein the logic circuit is configured to find the voltage value periodically at a frequency less than or equal to 12 kilohertz.

7. A method for detecting at least one electromagnetic signal comprising:
    generating a table of voltages and corresponding flux biases that result in maximum sensitivity of a superconducting quantum interference device array (SQUID array) and storing the table in a memory store;
    moving the SQUID array relative to the Earth's magnetic field;
    monitoring an output voltage of the SQUID array;
    at timed intervals, finding a voltage value in the memory store that most closely matches the output voltage; and
    applying to the SQUID array a flux bias from the table that corresponds to the most closely matched voltage value.

8. The method of claim 7, wherein the SQUID array is planar.

9. The method of claim 7, wherein a characteristic magnetic-flux-to-voltage transfer curve is not periodic.

10. The method of claim 9, further comprising applying the flux bias to actively compensate for the slowest-varying and highest-amplitude components of an incident magnetic field to the SQUID array such that while the SQUID array moves relative to the Earth's magnetic field the SQUID array retains a magnetic bias point.

11. The method of claim 7 further comprising using a processor to perform the following calculation at every timed interval:

$$\Phi_n = \Phi_{n-1} + \frac{1}{B}\sum_{i=1}^{n}(v_i - v_{i-1})$$

where B represents the sensitivity of the SQUID array, Φ represents the magnetic flux, n represents the number of timed intervals, and i is an index.

12. The method of claim 11 wherein successive timed intervals occur at a frequency less than or equal to 12 kilohertz.

13. A method for detecting at least one electromagnetic signal comprising:
    generating a table of voltages and corresponding flux biases that result in maximum sensitivity of a superconducting quantum interference device array (SQUID array) and storing the table in a memory store;
    moving the SQUID array with changing orientation relative to the Earth's magnetic field,
    monitoring an output voltage of the SQUID array;
    using a processor to incrementally adjust a magnetic flux bias of the SQUID array at timed intervals based on the monitored output voltage so as to maintain the flux bias within a predetermined range.

14. The method of claim 13, further comprising:
    using a bias tee to divide a signal from the SQUID array into the output voltage and a radio frequency (RF) signal.

15. The method of claim 14, further comprising using the processor to perform the following control calculation at every timed interval:

$$\Phi_n = \Phi_{n-1} + \frac{1}{B}\sum_{i=1}^{n}(v_i - v_{i-1})$$

where B represents the sensitivity of the SQUID array, v represents the output voltage, Φ represents the magnetic flux, n represents a time, and i is an index.

16. The method of claim 15, further comprising:
    actively updating the magnetic flux bias to maintain a minimum sensitivity threshold in response to changes in SQUID array sensitivity.

* * * * *